United States Patent
Yang et al.

(10) Patent No.: US 11,452,229 B2
(45) Date of Patent: Sep. 20, 2022

(54) CABLE BACKPLANE BOARD, CABLE BOX AND CABLE ASSEMBLY

(71) Applicant: ZTE CORPORATION, Guangdong (CN)

(72) Inventors: Zhiwei Yang, Guangdong (CN); Yingchun Shang, Guangdong (CN)

(73) Assignee: ZTE CORPORATION, Guangdong (CN)

( * ) Notice: Subject to any disclaimer, the term of this patent is extended or adjusted under 35 U.S.C. 154(b) by 262 days.

(21) Appl. No.: 16/958,841

(22) PCT Filed: Oct. 29, 2018

(86) PCT No.: PCT/CN2018/112506
§ 371 (c)(1),
(2) Date: Jun. 29, 2020

(87) PCT Pub. No.: WO2019/128448
PCT Pub. Date: Jul. 4, 2019

(65) Prior Publication Data
US 2021/0076527 A1 Mar. 11, 2021

(30) Foreign Application Priority Data
Dec. 29, 2017 (CN) .......................... 201711484830.6

(51) Int. Cl.
*H01R 12/75* (2011.01)
*H05K 7/14* (2006.01)

(52) U.S. Cl.
CPC ........... *H05K 7/1449* (2013.01); *H01R 12/75* (2013.01); *H05K 7/1452* (2013.01)

(58) Field of Classification Search
CPC ..... H01R 12/75; H05K 7/1449; H05K 7/1452
(Continued)

(56) References Cited

U.S. PATENT DOCUMENTS 5,519,583 A 5/1996 Kolling et al.
6,482,046 B1 * 11/2002 Salinas ................ H01R 13/506
439/923

(Continued)

FOREIGN PATENT DOCUMENTS

CN 101984599 A 3/2011
CN 102576137 A 7/2012
(Continued)

OTHER PUBLICATIONS

Search Report for the Chinese Application No. 2017114848306, dated Oct. 9, 2020, 2 pages.
(Continued)

*Primary Examiner* — Abdullah A Riyami
*Assistant Examiner* — Vladimir Imas
(74) *Attorney, Agent, or Firm* — KDB Firm PLLC

(57) ABSTRACT

Provided are a cable backplane board, a cable box and a cable assembly. The cable backplane board is mounted on a sub-rack and includes at least one cable box, where each of the at least one cable box includes a box body and at least one cable assembly, and each of the at least one cable assembly includes at least two electrical connectors and at least one cable, where the at least two electrical connectors are fixed to the box body, the at least one cable is disposed inside the box body, and the at least two electrical connectors are connected to each other through the at least one cable; and a plurality of single boards on the sub-rack is interconnected through the electrical connectors and the cable.

20 Claims, 18 Drawing Sheets

(58) Field of Classification Search
USPC ........................................................ 174/74 R
See application file for complete search history.

(56) References Cited

U.S. PATENT DOCUMENTS

| | | | | |
|---|---|---|---|---|
| 6,498,716 | B1* | 12/2002 | Salinas ................... | G06F 1/189 |
| | | | | 439/341 |
| 6,748,458 | B2* | 6/2004 | Andrewartha .......... | G06F 1/189 |
| | | | | 710/305 |
| 7,134,913 | B1* | 11/2006 | Hasircoglu ........ | H01R 13/6593 |
| | | | | 439/607.41 |
| 7,194,181 | B2* | 3/2007 | Holmberg ............ | G02B 6/4452 |
| | | | | 385/134 |
| 8,410,364 | B2* | 4/2013 | Dunwoody .......... | H05K 7/1491 |
| | | | | 174/72 A |
| 8,947,888 | B2* | 2/2015 | Peterson ................ | H01R 12/00 |
| | | | | 361/776 |
| 9,089,068 | B2 | 7/2015 | Sechrist et al. | |
| 9,326,417 | B2* | 4/2016 | Ritter ....................... | H04Q 1/15 |
| 9,490,571 | B1* | 11/2016 | Annis ................ | H01R 13/5219 |
| 9,570,861 | B2* | 2/2017 | Thackston ............. | H01R 12/62 |
| 9,711,889 | B2* | 7/2017 | Sechrist ............... | H01R 13/514 |
| 9,801,301 | B1 | 10/2017 | Costello | |
| 10,136,196 | B2* | 11/2018 | Ritter ....................... | H04Q 1/15 |
| 10,302,885 | B2* | 5/2019 | Morris ................... | G02B 6/445 |
| 10,725,259 | B2* | 7/2020 | Morris ................. | G02B 6/4452 |
| 2003/0002261 | A1 | 1/2003 | Berry et al. | |
| 2004/0201975 | A1 | 10/2004 | Bravo et al. | |
| 2008/0096438 | A1* | 4/2008 | Clark ................... | H01R 13/518 |
| | | | | 439/713 |
| 2009/0269019 | A1* | 10/2009 | Andrus ................. | H04Q 1/155 |
| | | | | 385/135 |
| 2012/0164878 | A1* | 6/2012 | Yi .......................... | H01R 24/52 |
| | | | | 439/540.1 |
| 2014/0360752 | A1 | 12/2014 | Sechrist et al. | |
| 2015/0029676 | A1 | 1/2015 | Nichols et al. | |
| 2017/0079155 | A1 | 3/2017 | Zhang et al. | |

FOREIGN PATENT DOCUMENTS

| | | |
|---|---|---|
| CN | 102893541 A | 1/2013 |
| CN | 103051566 A | 4/2013 |
| CN | 103503590 A | 1/2014 |
| CN | 103718658 A | 4/2014 |
| CN | 104064893 A | 9/2014 |
| CN | 104812168 A | 7/2015 |
| CN | 105024189 A | 11/2015 |
| CN | 105281917 A | 1/2016 |
| CN | 105717583 A | 6/2016 |
| CN | 107317770 A | 11/2017 |
| CN | 107360693 A | 11/2017 |
| CN | 107437669 A | 12/2017 |
| CN | 108011214 A | 5/2018 |
| CN | 108879150 A | 11/2018 |
| EP | 3197112 A1 | 7/2017 |
| JP | 2017521960 A | 8/2017 |

OTHER PUBLICATIONS

Office Action for the Chinese Application No. 2017114848306, dated Oct. 9, 2020, 6 pages.
Search Report for the Chinese Application No. 2017114848306, dated May 27, 2021, 3 pages.
Office Action for the Chinese Application No. 2017114848306, dated May 27, 2021, 8 pages.
International Search Report for the International Patent Application No. PCT/CN2018/112506, dated Jan. 30, 2019, 2 pages.
European Search Report and Written Opinion for the European Patent Application No. EP18894194, dated Aug. 12, 2021, 11 pages.
Notice of Third Examination Opinion for CN 201711484830.6, dated Sep. 29, 2021.
Supplemental Search Report for for CN 201711484830.6, dated Sep. 29, 2021.
Office Action for the Japanese Patent Application No. 2020536560, dated Jun. 18, 2021, 4 pages.

* cited by examiner

CABLE BACKPLANE BOARD, CABLE BOX AND CABLE ASSEMBLY

CROSS-REFERENCE TO RELATED APPLICATIONS

This is a National Stage Application, filed under 35 U.S.C. 371, of International Patent Application No. PCT/CN2018/112506, filed on Oct. 29, 2018, which is based on and claims priority to Chinese patent application No. 201711484830.6 filed on Dec. 29, 2017, disclosures of which are incorporated herein by reference in their entireties.

TECHNICAL FIELD

The present application relates to, but is not limited to, the field of communications and, in particular, relates to a cable backplane board, a cable box and a cable assembly.

BACKGROUND

With an increasing demand for the Internet of Everything, the Internet develops more and more rapidly, and a large number of services are instantly transferred between different stations, which imposes an increasingly high requirement on a switching capacity of switching devices in a network. A centralized switching device based on an optical transport network (OTN), a packet transport network (PTN) and other fields is generally composed of several line cards (LCs) and several switch cards (SCs). A sufficient number of physical connection channels are to be provided between each LC and each SC, where these channels mainly achieve the interconnection of high-speed signals between each LC and each SC through a printed circuit board (PCB).

The LC may be referred to as a service board, a circuit board, a customer board, a tributary board, etc. in different devices, and is a PCB card that supports the access or transmission of an external service, and communicates with a switch board through a backplane board socket. The SC may be referred to as the switch board, a cross-board, etc. in different devices, and is a PCB card that implements a service exchange or cross-scheduling function between LCs.

However, the interconnection of single boards in a sub-rack achieved through the PCB mainly has two problems: firstly, an electrical signal has significantly increased transmission losses as its rate improves, so that the electrical signal can only be transferred for a very short distance and cannot be correctly received by a receiving end after it is transmitted for a slightly longer distance, such as 30 cm, that is, it is difficult to achieve the long-distance transmission of the electrical signal between boards inside the sub-rack through the PCB; secondly, with an increase of single slots and a device capacity, a number of signal connections also greatly increases, and a number of layers and a thickness of the PCB approximate a limit of manufacturing processes of a factory, that is, it is difficult to produce PCBs that meet the rate and a number of signals.

SUMMARY

The embodiments of the present application provide a cable backplane board, a cable box and a cable assembly.

The embodiments of the present application provide a cable backplane board capable of being mounted on a sub-rack. The cable backplane board includes at least one cable box, where each of the at least one cable box includes a box body and at least one cable assembly, and each of the at least one cable assembly includes at least two electrical connectors and at least one cable, where the at least two electrical connectors are fixed to the box body, the at least one cable is disposed inside the box body, and the at least two electrical connectors are connected to each other through the at least one cable; and a plurality of single boards on the sub-rack is interconnected through electrical connectors and cables.

The embodiments of the present application further provide a cable box. The cable box includes a box body and at least one cable assembly, where each of the at least one cable assembly includes at least two electrical connectors and at least one cable, where the at least two electrical connectors are fixed to the box body, the at least one cable is disposed inside the box body, and the at least two electrical connectors are connected to each other through the at least one cable; and a plurality of single boards on a sub-rack is interconnected through electrical connectors and cables.

The embodiments of the present application further provide a cable assembly. The cable assembly includes at least two electrical connectors and at least one cable. The at least two electrical connectors are connected to each other through the at least one cable, a front face of each of the at least two electrical connectors is connected to a single board, a back face of the each of the at least two electrical connectors is connected to one or more cables, and two ends of each of the at least one cable are separately connected to two electrical connectors.

The cable backplane board in the embodiments of the present application can reduce transmission losses of a high-speed signal, extend an interconnection distance of single boards in the sub-rack, increase a rate of interconnected signals, enhance electrical performance of connections, increase a number of connections of a port, and improve a switching capacity of the sub-rack. The cable backplane board is divided into multiple cable boxes, and the multiple cable boxes are divided into multiple cable assemblies, which can greatly reduce a manufacturing difficulty of the cable backplane board, and thereby reduce costs and an assembly difficulty of the cable backplane board.

Other features and advantages of the present application will be elaborated hereinafter in the description and, moreover, become apparent in part from the description, or will be understood through the implementation of the present application. The object and other advantages of the present application can be achieved and obtained through structures set forth in the description, claims and drawings.

BRIEF DESCRIPTION OF DRAWINGS

The drawings are provided for a further understanding of the technical solutions of the present application, and constitute a part of the specification. The drawings together with embodiments of the present application are used for explaining the technical solutions of the present application, and not intended to limit the technical solutions of the present application.

Figure 1:
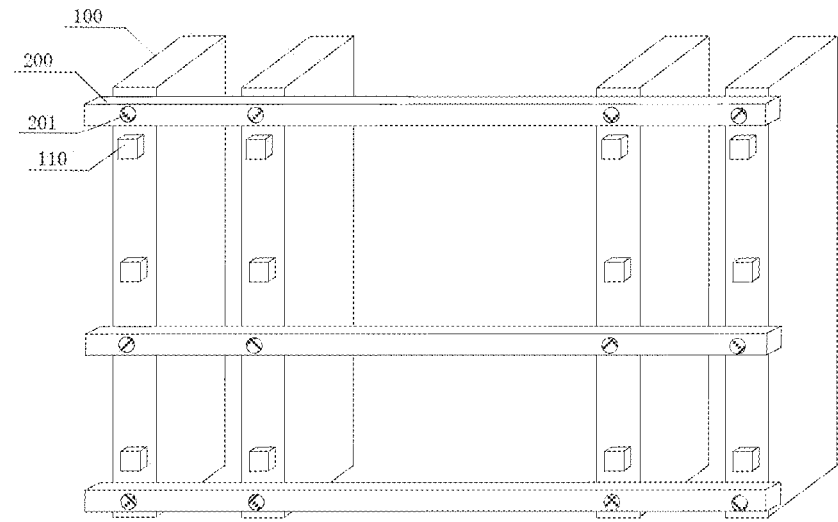
FIG. 1 is a schematic view of a cable backplane board according to an embodiment of the present application.

DESCRIPTION OF REFERENCE NUMERALS 100. cable box; 200. structural fixing member; 201. screw; 110. electrical connector (on the cable box/cable assembly); 111. first-type electrical connector (on the cable box/cable assembly); 112. second-type electrical connector (on the cable box/cable assembly); 1111. first-type electrical connector in an upper layer on a front face (on the cable box/cable assembly); 1112. first-type electrical connector in a lower layer on the front face (on the cable box/cable assembly); 1113. first-type electrical connector in the upper layer on a back face (on the cable box/cable assembly); 1114. first-type electrical connector in the lower layer on the back face (on the cable box/cable assembly); 1121. second-type electrical connector on the front face (on the cable box/cable assembly), 1122. second-type electrical connector on the back face (on the cable box/cable assembly), 120. box body; 130. cable assembly; 140. cable; 150. structural member; 102. region of electrical connectors on the cable backplane board corresponding to an LC; 105. region of electrical connectors on the cable backplane board corresponding to an SC; 210. LC; 211. electrical connector (on the LC); 220. SC; 221. electrical connector (on the SC), 230. electrical connector (on a single board).

DETAILED DESCRIPTION

To illustrate the object, technical solutions and advantages of the present application clearer, the embodiments of the present application will be described hereinafter in detail in conjunction with the drawings. It is to be noted that if not in collision, the embodiments and features therein in the present application may be combined with each other.

A high-speed cable or wire has better performance than a PCB, for example, a decay of a high-speed electrical signal in a 1-meter high-speed cable is less than ⅙ of a decay of an electrical signal with a same rate in a high-speed sheet PCB. The embodiments of the present application propose making a cable backplane board inside a sub-rack based on the cable, where the cable backplane board is applicable to the design and manufacturing of a high-rate, large-capacity sub-rack.

However, if all electrical connectors are cross-connected by simply using cables to form a large cable backplane board, connectors are cross-connected and mixed with a large number of cables, so that the large number of cables and the connectors are very difficult to be sorted and wired when the backplane board is assembled, and the connectors are pulled together by cables, which brings great inconvenience to the assembly of the backplane board. Moreover, connectors to be interconnected have different distances, and thus cables of various lengths are needed, which brings great difficulty to the production of cables, and cables of different lengths are mounted at different positions, which brings greater difficulty to the assembly of the backplane board. Therefore, this manner will cause complicated manufacturing processes and a large manufacturing difficulty of the cable backplane board, is not conducive to mass production, and has very high costs.

In view of this, the embodiments of the present application provide a cable backplane board. The cable backplane board with a large number of connections is divided into multiple cable boxes, and connectors and cables in each cable box constitute multiple cable assemblies to avoid a manufacturing difficulty due to cross-connections between too many connectors in the cable backplane board and multiple connectors. The present application can greatly reduce the manufacturing difficulty of the cable backplane board, reduce costs and an assembly difficulty of the cable backplane board, and also greatly improve a switching capacity of a sub-rack system.

For ease of description, cables and wires are collectively referred to as cables in the embodiments of the present application.

As shown in FIG. 1, the cable backplane board in the embodiments of the present application can be mounted onto a sub-rack, and includes at least one cable box 100.

For example, the cable backplane board has a mounting position or a mounting element mounted onto the sub-rack, so that the cable backplane board can be mounted onto the sub-rack. The cable backplane board may further include at least one structural fixing member 200 for fixing the cable box. Multiple cable boxes 100 may be assembled together through the structural fixing member 200 to form the complete cable backplane board. In FIG. 1, the structural fixing member 200 and the cable box 100 may be fixed by screws 201 or in other manners, for example, the structural fixing member 200 and the cable box 100 may also be connected by a clip. It is not limited in the embodiments of the present application.

Figure 2:
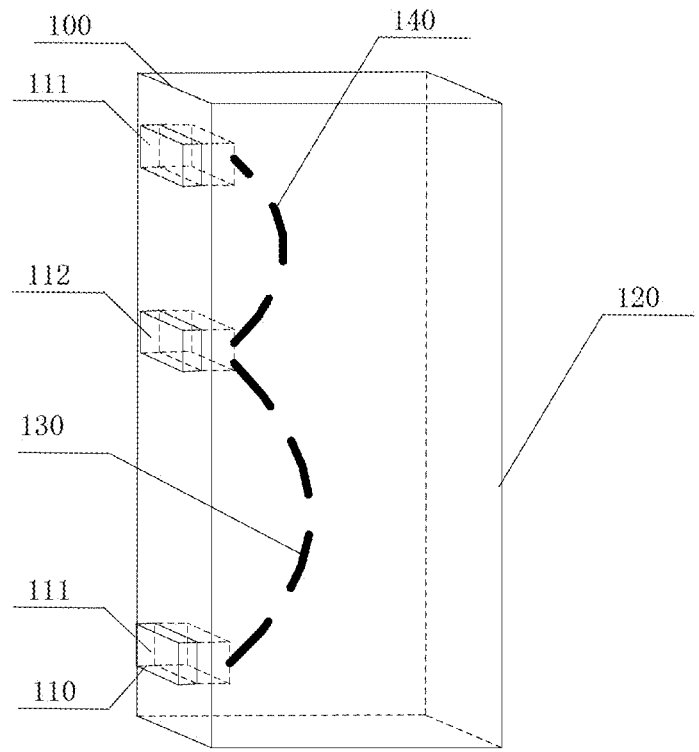
FIG. 2 is a schematic view of a cable box according to an embodiment of the present application.
Figure 3:
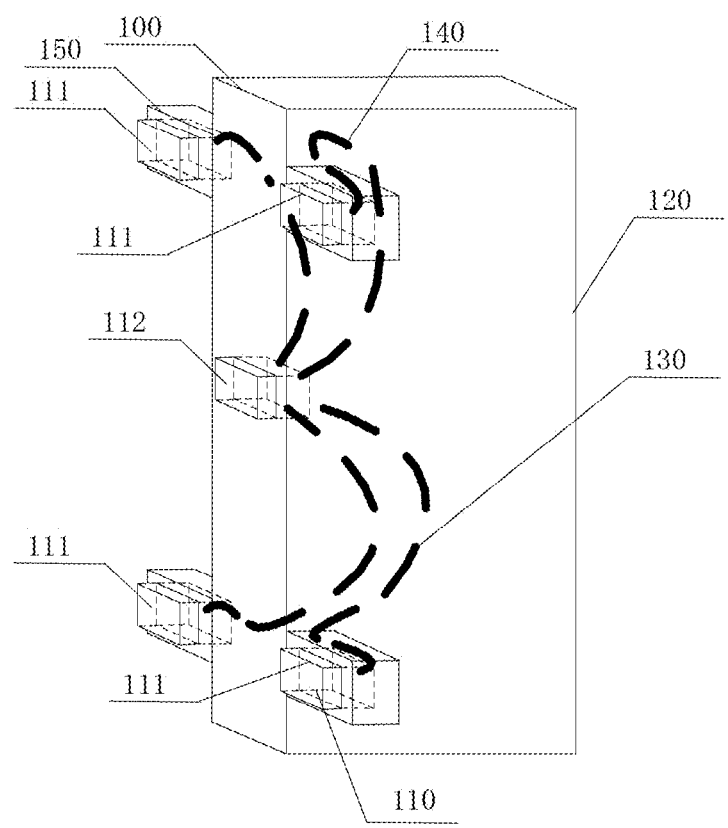
FIG. 3 is a schematic view of a cable box according to another embodiment of the present application.

As shown in FIGS. 2 and 3, the cable box 100 includes a box body 120 and at least one cable assembly 130, and the cable assembly 130 includes at least two electrical connectors 110 and at least one cable 140, where the electrical connectors 110 are fixed to the box body 120, the cable 140 is disposed inside the box body 120, and the at least two electrical connectors 110 are connected to each other through the cable 140. The interconnection of multiple single boards on the sub-rack is achieved through the electrical connectors 110 and the cable 140.

The cable backplane board in the embodiments of the present application can reduce transmission losses of a high-speed signal, extend an interconnection distance of single boards in the sub-rack, increase a rate of interconnected signals, enhance electrical performance of connections, increase a number of connections of a port, and improve a switching capacity of the sub-rack. The cable backplane board with a large number of connections is divided into multiple cable boxes, and the multiple cable boxes are divided into multiple cable assemblies, which can greatly reduce a manufacturing difficulty of the cable backplane board, and thereby reduce costs and an assembly difficulty of the cable backplane board.

A front face of the electrical connector 110 is connected to a single board, a back face of the electrical connector 110 is connected to one or more cables 140, and two ends of the cable 140 are separately connected to two electrical connectors 110.

In this embodiment, the front face and the back face of the electrical connector 110 are opposite to each other.

The box body 120 may be a metal box body or a plastic box body or a box body which is partially metal and partially plastic, etc. The box body 120 may be a regular cube as shown in FIGS. 1 and 2, or have an irregular shape, as shown in FIG. 3. In FIG. 3, structural members 150, such as small cubes, are added on two sides of the regular cube, so that the electrical connectors 110 are fixed on the small cubes.

Openings are formed on a front or back face of the box body 120 to fix the electrical connectors 110. In FIGS. 1 and 2, the electrical connectors 110 are all placed on the front face. Similarly, the electrical connectors 110 are placed on the back face or on the front and back faces by the same method. The electrical connector 110 is fixed in the opening formed on the front or back face of the box body 120 to be connected to an electrical connector on the single board (for example, an LC or an SC). As for a manner of fixing the electrical connector 110 to the box body 120, the electrical connector 110 may be embedded into the opening of the box body 120 through its own protrusion or other structures, or the electrical connector 110 may be bound through an external auxiliary fixing member to the box body 120. Moreover, a width of the front or back face of the box body 120 and a width of the electrical connector 110 are not limited, and the box body 120 is not necessarily a regular rectangular parallelepiped, and may have an irregular shape. If the width of the electrical connector 110 is greater than a width of a portion of the box body 110 for fixing the cable, the box body 120 may increase a width at a fixing position of the electrical connector 110 so as to wrap or fix the electrical connector 110. In addition, when the electrical connector 110 is connected to the electrical connector on the card, a guide pin and a floating means or function may be required so that the two electrical connectors can still be mated normally in the case of a positional deviation.

An insertion face of the electrical connector 110 for the single board may be an insertion pin or a connection face of a socket. The insertion face of the electrical connector 110 faces an outside of the cable box 100, and the other face (which may be an opposite face of the insertion face) of the electrical connector 110 is connected to the cable 140 and faces an inside of the cable box 100, that is, the card may be connected to the cable 140 inside the cable box 100 through the electrical connector 110. The box body 120 is empty inside, and may accommodate high-speed cables, that is, the cable 140 is placed inside the cable box 100.

In some embodiments of the present application, the electrical connector 110 includes a first-type electrical connector 111 and a second-type electrical connector 112, where the first-type electrical connector 111 is configured to be connected to a first-type single board, and the second-type electrical connector 112 is configured to be connected to a second-type board. An end of the cable 140 is connected to the first-type electrical connector 111 and the other end is connected to the second-type electrical connector 112. As shown in FIG. 2, the first-type single board may be connected to the cable 140 through the first-type electrical connector 111, then connected to the second-type electrical connector 112 through the cable 140, and then connected to the second-type board connected to the second-type electrical connector 112, so that high-speed interconnection between the first-type single board and the second-type board in one pair is achieved.

It is to be noted that the electrical connector 110 is divided into the first-type electrical connector 111 and the second-type electrical connector 112, to distinguish the electrical connectors 110 connected to different types of card, which does not mean that the first-type electrical connector 111 and the second-type electrical connector 112 are different in shape or structure. The first-type electrical connector 111 and the second-type electrical connector 112 may be connectors of the same model.

In some embodiments, a first-type connector 111 and a second-type connector 112 may be different types of connector. These two types of connectors can be connected to different types of single boards. In some embodiments, the first-type connector 111 may differ from the second-type connector 112 in any one of the following aspects:

The first-type connector 111 and the second-type connector 112 have different appearances.

A number of connection terminals for connecting the card on the first-type connector 111 is different from that on the second-type connector 112.

The connection terminals for connecting the card on the first-type connector 111 are different in type from those on the second-type connector 112.

The connection terminals for connecting the card on the first-type connector 111 are arranged in a different manner than those on the second-type connector 112.

The first-type connector 111 and the second-type connector 112 follow different standards or protocols for electrical signal transmission.

In some embodiments of the present application, the card includes the first-type single board vertically mounted in the sub-rack and the second-type board horizontally mounted in the sub-rack, and each cable box 100 is vertically mounted in the sub-rack and can be connected to all first-type single boards in one or more vertical columns in the sub-rack and each second-type board horizontally mounted in the sub-rack. Each cable box 100 is provided with mounting positions or mounting elements capable of mounting one or more first-type single boards on the sub-rack.

That is to say, in the embodiments of the present application, the first-type single board is a vertical card, and the second-type board is a horizontal card.

In the embodiments of the present application, through a combination of multiple vertical cable boxes 100, a certain gap exists between the cable boxes 100 and can provide a front-back through air passage for a layer of horizontal insertion boards, thereby solving the problem of heat dissipation of the horizontal insertion boards.

In some embodiments, a heat dissipation structure may also be provided in the gap between the cable boxes 100, where the heat dissipation structure may include a metal heat dissipation fin with good thermal conductivity.

In some embodiments of the present application, the first-type single board is the LC, the second-type board is the SC, the first-type electrical connector is used for being connected to the LC, and the second-type electrical connector is used for being connected to the SC; or the first-type single board is the SC, the second-type board is the LC, the first-type electrical connector is used for being connected to the SC, and the second-type electrical connector is used for being connected to the LC.

The sub-rack in the embodiments of the present application adopts a layered structure, the LC and the SC are in different layers, and the LC is perpendicular to the SC, that is, the LC is vertically inserted and the SC is horizontally inserted, or the LC is horizontally inserted and the SC is vertically inserted. That is to say, when the LC is vertically inserted and the SC is horizontally inserted, the first-type single board is the LC, and the second-type board is the SC; when the LC is horizontally inserted and the SC is vertically inserted, the first-type single board is the SC, and the second-type board is the LC.

The sub-rack in the embodiments of the present application may adopt a single-faced sub-rack or a double-faced sub-rack. If it is the double-faced sub-rack, the cable backplane board has same connections on a front face and a back face of the sub-rack; and it is applicable to a two-layer or three-layer sub-rack, where each layer is all provided with LCs or SCs. If the sub-rack is the two-layer sub-rack, SCs or LCs are randomly arranged in upper or lower layers. If the sub-rack is the three-layer sub-rack, SCs are arranged in a middle layer.

In some embodiments of the present application, the cable box 100 is connected to each first-type single board in the one or more vertical columns through at least one first-type electrical connector 111; and the cable box 100 is connected to each horizontally mounted second-type board through one second-type electrical connector 112.

Each column of vertical insertion boards (the first-type single boards) is connected to one cable box 100. One cable box 100 is connected to one or more columns of vertical insertion boards. One cable box 100 is connected to each horizontal card (the second-type board).

In practical applications, the cable backplane board is divided into m/k cable boxes 100 (k is a positive integer) according to a number m of vertical insertion boards in a single layer on a single face of the sub-rack, that is, every k vertical insertion boards correspond to one cable box 100.

In some embodiments of the present application, the cable box 100 is connected to each first-type single board in the one or more vertical columns through n first-type electrical connectors 111, where n is a number of second-type boards horizontally mounted in a single layer on a single face of the sub-rack.

One cable box 100 is connected to each vertical card through n electrical connectors and is connected to each horizontal card through one electrical connector. Here, n may be any positive integer, for example, n may be a positive integer of 2 or more.

In some embodiments of the present application, each cable box 100 includes n cable assemblies 130.

Each cable assembly 130 connects the electrical connectors on the cable box corresponding to one horizontal card in each layer of horizontal insertion boards to one electrical connector on the cable box corresponding to each vertical card.

In some embodiments of the present application, each cable assembly 130 in the cable box 100 includes p first-type electrical connectors 111 and q second-type electrical connectors 112, where p is a number of the first-type single boards in the one or more vertical columns corresponding to the cable box 100, and the p first-type electrical connectors 111 are separately connected to the p first-type single boards corresponding to the cable box 100. When the sub-rack is single-faced, q is 1, and the q second-type electrical connector 112 are connected to one second-type board horizontally mounted in the single layer on the single face. When the sub-rack is double-faced, q is 2, and the q second-type electrical connectors 112 are separately connected to one second-type board on each face of the sub-rack.

FIGS. 2 and 3 show one cable assembly inside the cable box. In FIG. 2, one cable assembly includes three electrical connectors 110 and two cables 140, where each cable 140 is used for connecting two electrical connectors 110. One end of the cable 140 is connected to the first-type electrical connector 111, and the other end is connected to the second-type electrical connector 112 (in FIG. 2, for example, the middle one is the second-type electrical connector 112, and the upper and lower ones are the first-type electrical connectors 111). In FIG. 3, one cable assembly includes five electrical connectors 110 and four cables 140, where each cable is used for connecting two electrical connectors 110. In an example in which the vertical insertion boards are arranged in the upper and lower layers of the sub-rack, and the horizontal card is arranged in the middle layer, one end of the cable 140 is connected to the first-type electrical connector 111, and the other end is connected to the second-type electrical connector 112 (in FIG. 3, for example, the middle one is the second-type electrical connector 112, and the upper and lower ones are the first-type electrical connectors 111).

Figure 4:
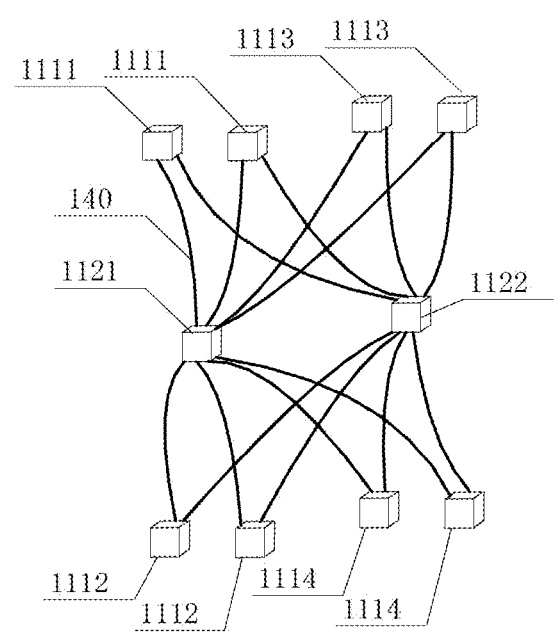
FIG. 4 is a schematic view of a cable assembly according to an embodiment of the present application.

FIG. 4 shows one cable assembly, which includes 10 electrical connectors 110 and 16 cables 140, where each cable 140 is used for connecting two electrical connectors 110. The cable assembly may be used in a sub-rack with cards inserted on both front and back faces. In this example, the LC is the first-type single board, the SC is the second-type board, and electrical connectors 1111 and 1112 are electrical connectors connected to LCs on the front face. For example, two electrical connectors 1111 are separately connected to two LCs in the upper layer, and two electrical connectors 1112 are separately connected to two LCs in the lower layer. An electrical connector 1121 is an electrical connector connected to the SC on the front face. The five electrical connectors 11, including the two electrical connectors 1111, the two electrical connectors 1112 and the electrical connector 1121, are fixed to the cable box in a same manner as those on the front face in FIG. 3. Electrical connectors 1113 and 1114 are electrical connectors connected to LCs on the back face. For example, two electrical connectors 1113 are connected to two LCs in the upper layer, and two electrical connectors 1114 are separately connected to two LCs in the lower layer. An electrical connector 1122 is an electrical connector connected to the SC on the back face. The five electrical connectors, including the two electrical connectors 1113, the two electrical connectors 1114 and the electrical connector 1122, are fixed to the cable box in the same manner as those in FIG. 3, but they are mounted on the back face of the cable box. 16 high-speed connections are present between 8 first-type electrical connectors and 2 second-type electrical connectors, as shown by the cables 140 in FIG. 4.

Each cable box 100 includes multiple electrical connectors 110, and the electrical connectors connected to the LCs and the electrical connectors connected to the SCs are connected by multiple cables 140. Thus, one cable box 100 can achieve the high-speed connection between at least one LC and at least one SC. The cable backplane board formed by combining multiple cable boxes 100 can achieve the cross-connections between all LCs and all SCs.

When the cable box is manufactured, the cable 140 and the electrical connectors 110 may be processed first to form one cable assembly 130, then the electrical connectors 110 of the cable assembly 130 may be fixed to the box body 120 of the cable box, and the cable 140 is placed inside the box body 120. For ease of mounting, one or more faces of the box body 120 may be made into an openable structure. After all cable assemblies 130 are assembled, an opened structural face is fixed. Finally, multiple cable boxes 100 are fixed or assembled into the cable backplane board through a certain structure.

A spacing between electrical connectors is reasonably designed, for example, a spacing between the electrical connector for the horizontal card and electrical connector for the vertical card in all layers may be maintained equal, so that cables 140 between electrical connectors 110 on the same face have the same length. Since the cable 140 requires a certain bend radius, a depth of the cable box 100 is reasonably designed, for example, the depth of the cable box 100 is a bend diameter of the cable 140, so that each cable 140 between electrical connectors 110 on different faces has the same length as the cable between electrical connectors 110 on the same face, that is, the 16 cables for high-speed connections in FIG. 4 have the same length. In this way, a processing difficulty of the cable assembly 130 can be greatly reduced, and troubles caused by the needs to mark each cable and process and assemble cables of different lengths when the cables of different lengths are processed and assembled can be avoided.

The cable assembly is easy to process. Each cable assembly is mounted independently in the cable box, and the cables cross in space in the cable box. It is also very convenient to assemble multiple same cable assemblies into one cable box and assemble multiple cable boxes into one cable backplane board, that is, the embodiments of the present application bring great convenience to the production and assembly of the cable backplane board.

This application embodiment provides a single-faced two-layer sub-rack (16 LCs are vertically inserted and 6 SCs are horizontally inserted), and one cable box is mated with one column of vertical insertion boards. The 16 LCs are vertically placed in the upper layer, namely LC1 to LC16, and the 6 SCs are horizontally placed in the lower layer, namely SC1 to SC6.

Figure 5:
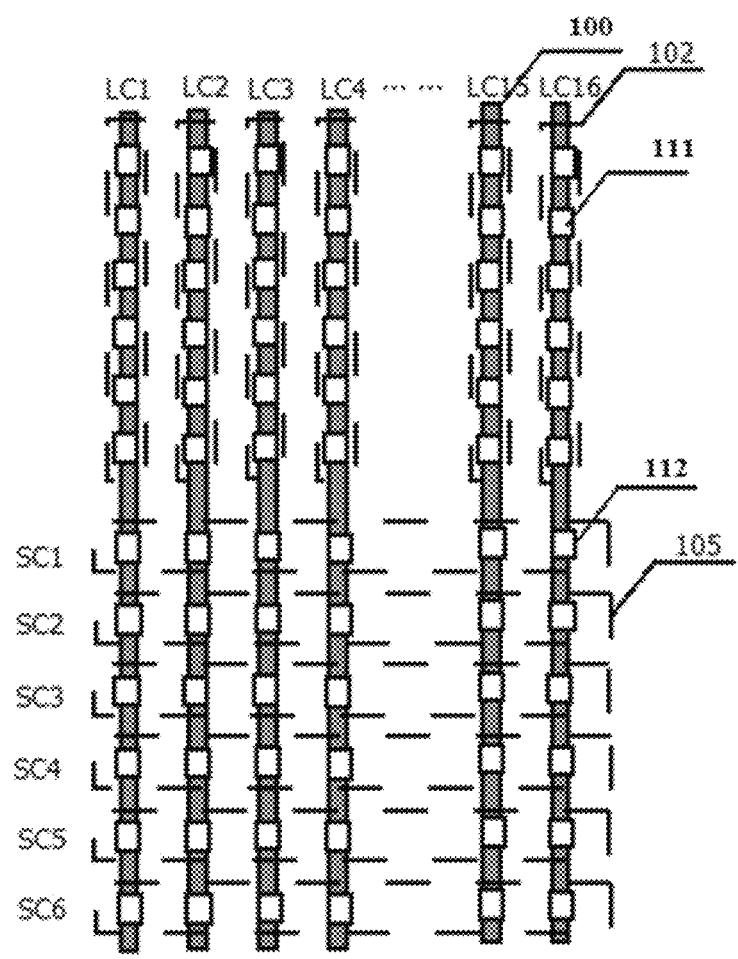
FIG. 5 is a front view showing a sub-rack according to an embodiment of the present application.
Figure 6:
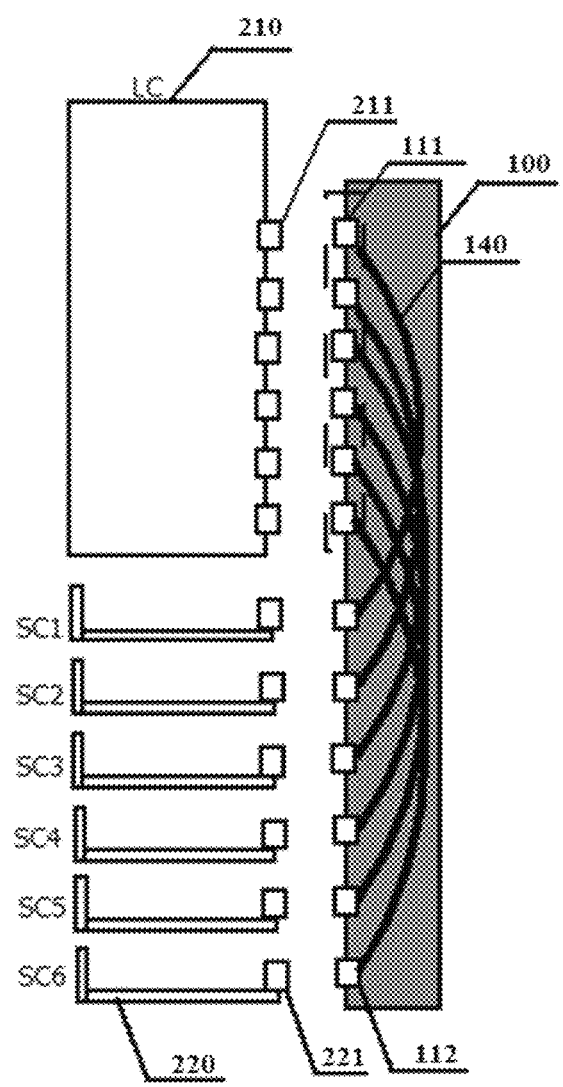
FIG. 6 is a side view showing a sub-rack according to an embodiment of the present application.
Figure 7:
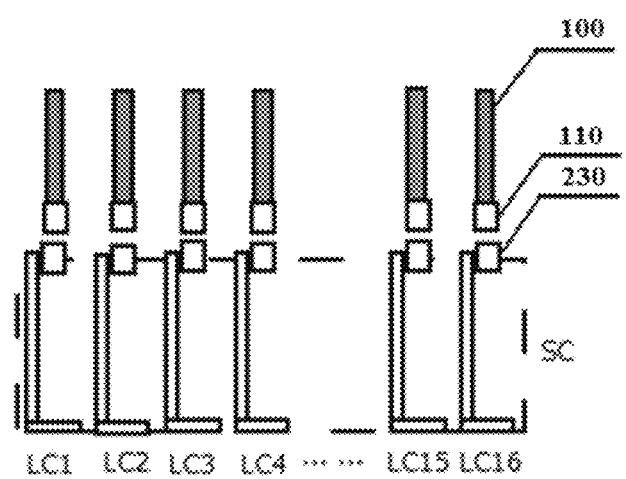
FIG. 7 is a top view showing a sub-rack according to an embodiment of the present application.

In this embodiment, the first-type single board is the LC, and the second-type board is the SC. FIGS. 5, 6 and 7 are respectively a front view, a side view and a top view of the sub-rack in this application embodiment. The front view, FIG. 5, shows the cable backplane board which includes 16 cable boxes 100, and each cable box 100 corresponds to one column of vertical LCs. For the LCs and SCs, only a region 102 (a dashed box) of electrical connectors on the cable backplane board corresponding to the LC and a region 105 (a dashed box) of electrical connectors on the cable backplane board corresponding to the SC are shown. The cable backplane board includes 16 vertical cable boxes 100. Each cable box 100 is connected to one LC 210 which is connected to 6 electrical connectors 111; and each cable box 100 is connected to all the SCs 220, each of which is connected to one electrical connector 112. Each SC 220 is connected to all the 16 cable boxes 100 through 16 electrical connectors 221 thereon.

In the side view, FIG. 6, one LC 210 is connected to 6 electrical connectors 111 on one cable box 100 through 6 electrical connectors 211 thereon; and the SC 220 is connected to one electrical connector 112 on the cable box 100 through the electrical connector 221 thereon. The electrical connectors 111 and the electrical connectors 112 are connected through multiple cables 140. In this application embodiment, one cable box 100 includes 6 cable assemblies, and each cable assembly connects one electrical connector 211 on the LC to one electrical connector 221 on the SC through the cable 140. Therefore, the 6 cable assemblies may connect all the 6 electrical connectors 211 corresponding to one LC 210 to 6 electrical connectors 221 corresponding to the 6 SCs 220. Meanwhile, the 6 electrical connectors 211 corresponding to the LC 210 and the electrical connectors 221 corresponding to the 6 SCs 220 may be arranged at equal intervals. In this way, the 6 cable assemblies may be made into same assemblies, so as to greatly reduce the processing difficulty of the cable assembly and reduce costs of the cable backplane board.

In the top view, FIG. 7, the cable boxes 100 are included, and each cable box 100 includes electrical connectors connected to the LC and electrical connectors connected to the SCs, where the electrical connectors connected to the LC and the electrical connectors connected to the SCs overlap in the top view and are represented as the electrical connector 110, corresponding to an electrical connector 230 which is the electrical connectors on the LC (drawn by solid lines) and the SC (drawn by dashed lines).

This embodiment provides a single-faced three-layer sub-rack (16 LCs are vertically inserted and 9 SCs are horizontally inserted), and one cable box is mated with one column of vertical insertion boards. 16 LCs are vertically placed in the upper layer, namely LC1 to LC16; 9 SCs are horizontally placed in the middle layer, namely SC1 to SC9; and 16 LCs are vertically placed in the lower layer, namely LC17 to LC32. The LCs in the upper layer may be inserted in the same direction as the LCs in the lower layer, or the LCs in the upper layer may be inserted in an opposite direction to that of the LCs in the lower layer (for example, the LCs in the upper layer are inserted upright, and the LCs in the lower layer are inserted upside down). This application embodiment illustrates opposite insertion directions.

Figure 8:
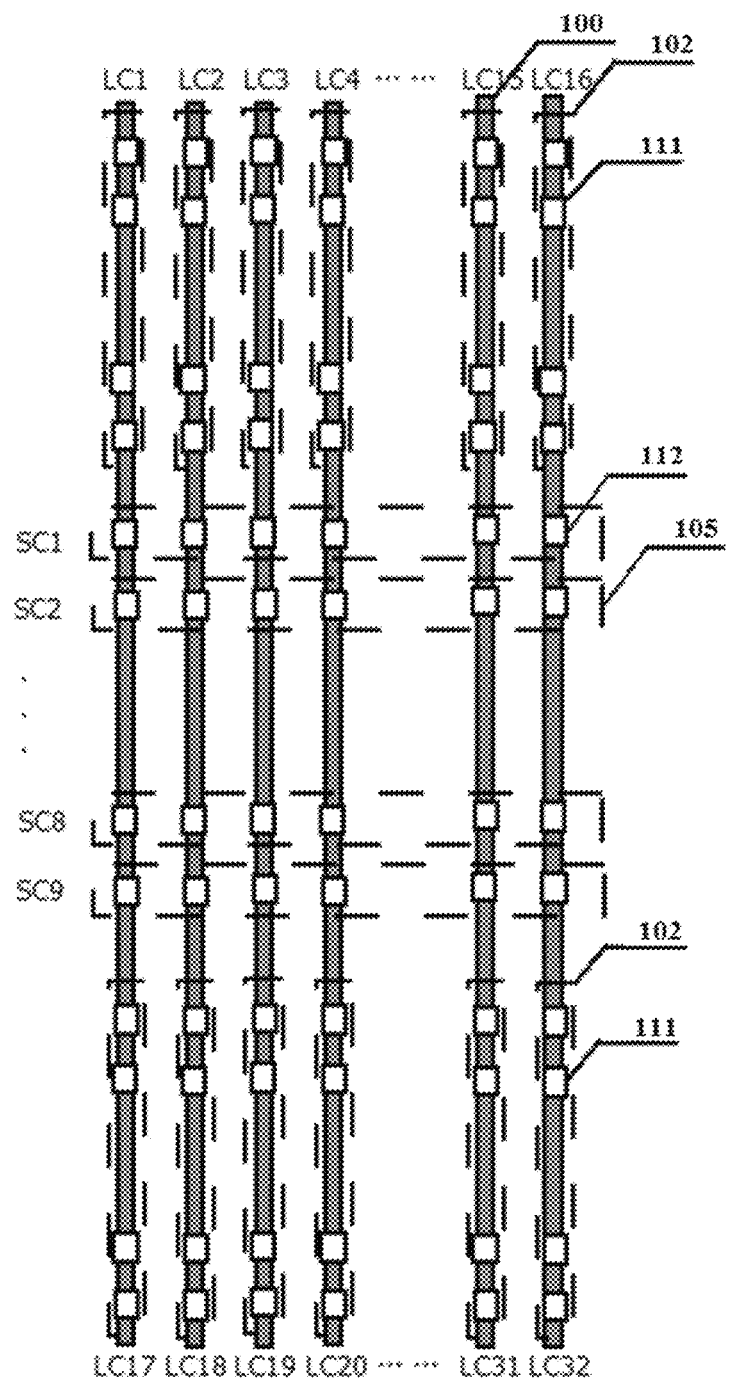
FIG. 8 is a front view showing a sub-rack according to an embodiment of the present application.
Figure 9:
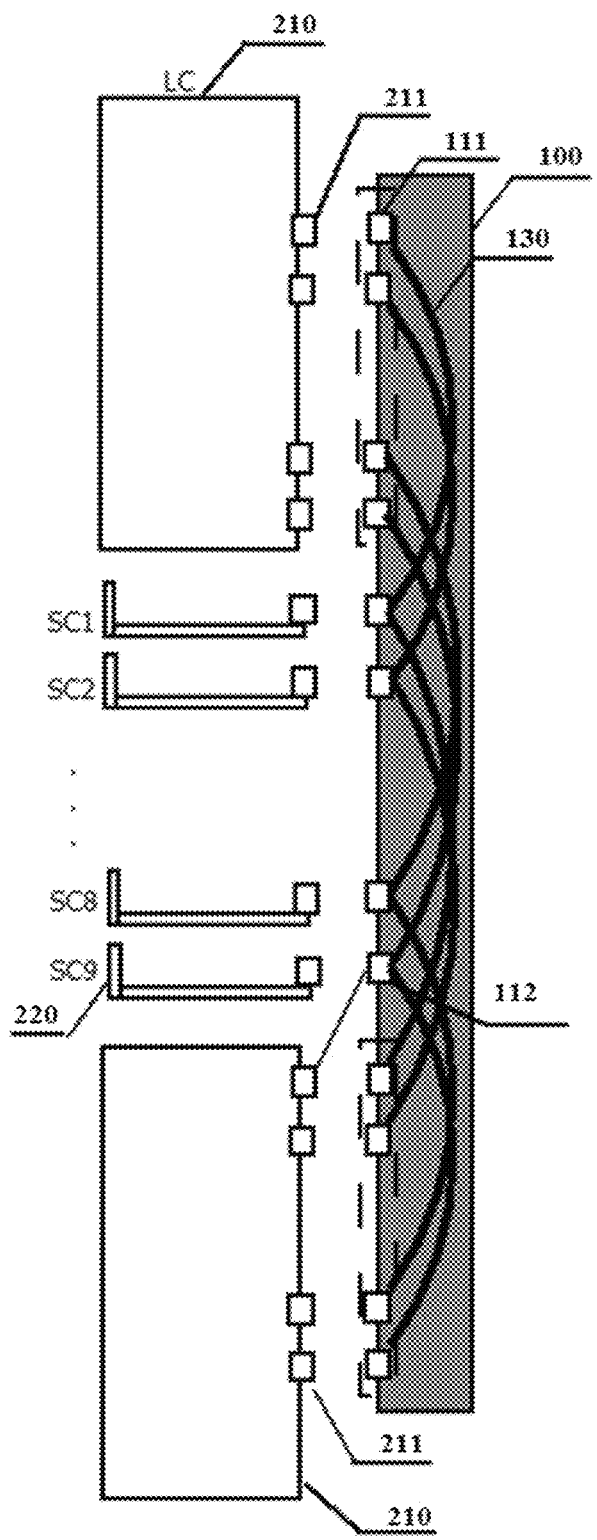
FIG. 9 is a side view showing a sub-rack according to an embodiment of the present application.
Figure 10:
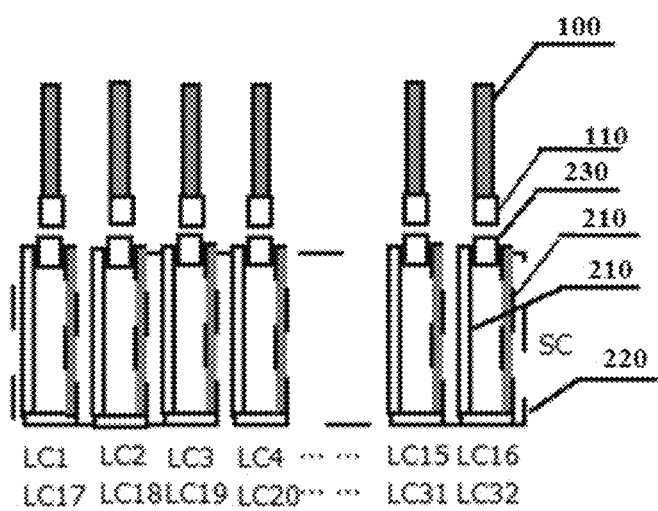
FIG. 10 is a top view showing a sub-rack according to an embodiment of the present application.

In this embodiment, the first-type single board is the LC, and the second-type board is the SC. FIGS. 8, 9 and 10 are respectively a front view, a side view and a top view of the sub-rack in this application embodiment. The front view, FIG. 8, does not show LCs and SCs, but shows cable boxes 100, a region 102 (a dashed box) of electrical connectors on the cable backplane board corresponding to the LC and a region 105 (a dashed box) of electrical connectors on the cable backplane board corresponding to the SC. The cable backplane board includes 16 vertical cable boxes 100. Each cable box 100 is connected to two LCs 210 in the upper and lower layers, and each LC in the upper and lower layers is connected to 9 electrical connectors 111 in the cable box 100; and each cable box 100 is connected to all the SCs 220, each of which is connected to one electrical connector 112. Each SC 220 is connected to all the 16 cable boxes 100 through electrical connectors 221.

In the side view, FIG. 9, one LC 210 in the upper layer is connected to 9 electrical connectors 111 on one cable box 100 through 9 electrical connectors 211 thereon; the SC 220 is connected to one electrical connector 112 on the cable box 100 through the electrical connector 221 thereon; and one LC 210 in the lower layer is connected to 9 electrical connectors 111 on one cable box 100 through 9 electrical connectors 211 thereon. The cable box includes 9 cable assemblies 130, and each cable assembly 130 connects one electrical connector 111 for the LC in the upper layer, one electrical connector 111 for the LC in the lower layer, and one electrical connector 112 for the SC in the middle layer, that is, each assembly includes two electrical connectors 111 for LCs and one electrical connector 112 for the SC, and then the two electrical connectors 111 for LCs are separately connected to the one electrical connector 112 for the SC through cables 140. The 9 cable assemblies 130 may connect 9 electrical connectors 211 corresponding to each of all two LCs 210 and 9 electrical connectors 221 corresponding to the 9 SCs 220. Meanwhile, 2 groups of 9 electrical connectors 221 for the LCs and the electrical connectors 221 corresponding to the 9 SCs may be arranged at equal intervals. The electrical connector corresponding to SC1 and first electrical connectors on the LCs may be preferably selected as one assembly. In the same way, the 9 cable assemblies 130 may be made into same assemblies, so as to greatly reduce the processing difficulty of the cable assembly and reduce the costs of the cable backplane board.

In the top view, FIG. 10, the cable boxes 100 are included, and each cable box 100 includes electrical connectors connected to the LCs and electrical connectors connected to the SCs, where the electrical connectors connected to the LCs and the electrical connectors connected to the SCs overlap in the top view and are represented as the electrical connector 110, corresponding to an electrical connector 230 which is the electrical connectors on the LC in the upper layer (drawn by solid lines), the SC (drawn by dashed lines), and the LC in the lower layer (a dashed box filled with gray).

This embodiment provides a single-faced three-layer sub-rack (16 LCs are horizontally inserted and 9 SCs are vertically inserted), and one cable box is mated with one column of vertical insertion boards. 16 LCs are horizontally placed in the upper layer, namely LC1 to LC16; 9 SCs are vertically placed in the middle layer, namely SC1 to SC9; and 16 LCs are horizontally placed in the lower layer, namely LC17 to LC32. The LCs in the upper layer are inserted in the same direction as the LCs in the lower layer.

Figure 11:
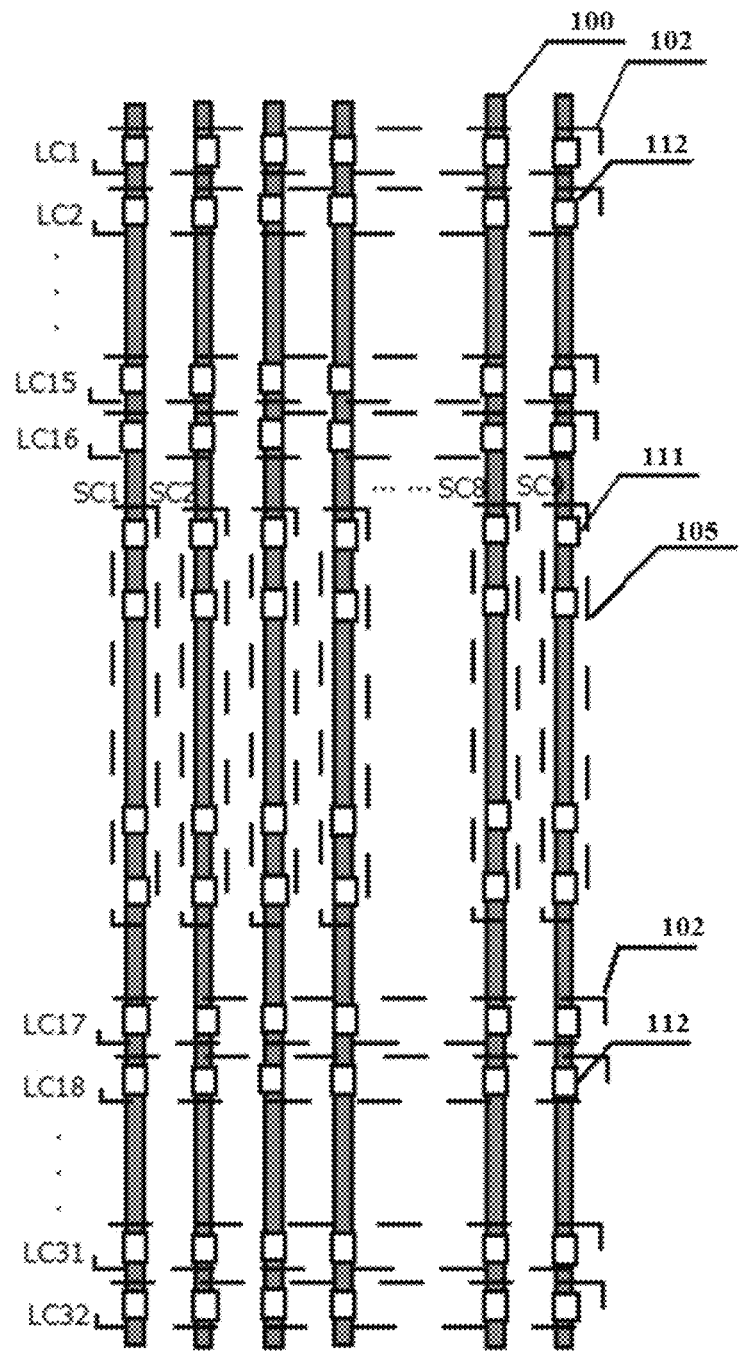
FIG. 11 is a front view showing a sub-rack according to an embodiment of the present application.
Figure 12:
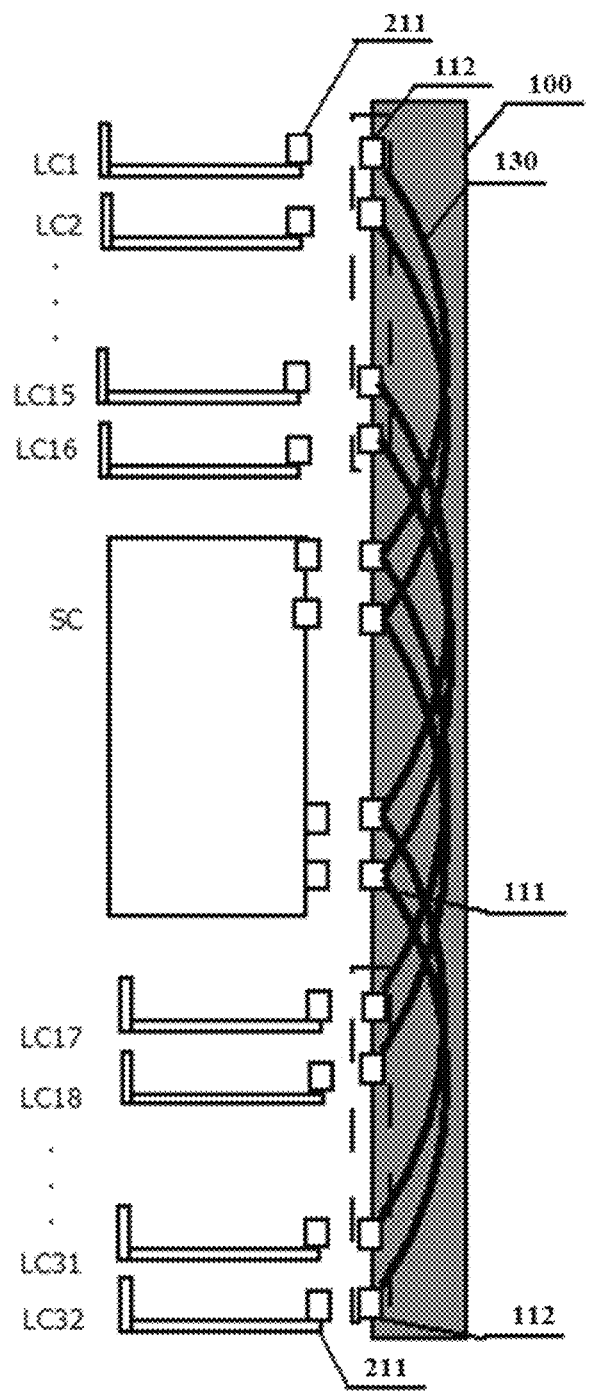
FIG. 12 is a side view showing a sub-rack according to an embodiment of the present application.
Figure 13:
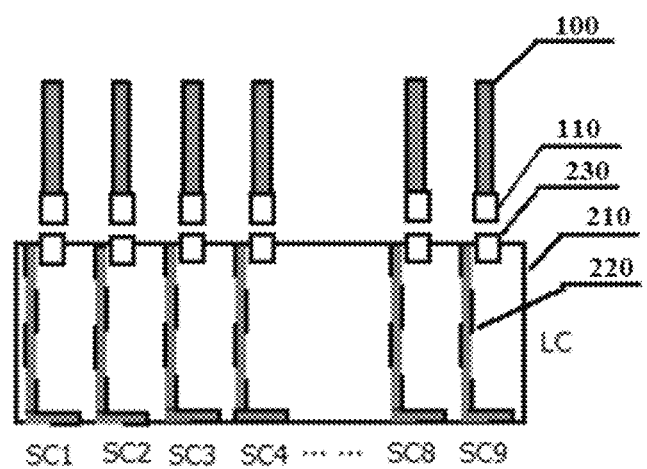
FIG. 13 is a top view showing a sub-rack according to an embodiment of the present application.

In this embodiment, the first-type single board is the SC, and the second-type board is the LC. FIGS. 11, 12 and 13 are respectively a front view, a side view and a top view of the sub-rack in this application embodiment. The front view, FIG. 11, does not show LCs and SCs, but shows cable boxes 100, a region 102 of electrical connectors on the cable backplane board corresponding to the LC and a region 105 (a dashed box) of electrical connectors on the cable backplane board corresponding to the SC. The cable backplane board includes 9 vertical cable boxes 100. Each cable box 100 is connected to all horizontal LCs 210 in the upper and lower layers, where each LC in the upper layer is connected to one electrical connector 112, and each LC in the lower layer is connected to one electrical connector 112; and each LC is connected to all the 9 cable boxes 100 through electrical connectors 211. Each cable box 100 is connected to one vertical SC 220 in the middle layer, and each SC 220 has 16 electrical connectors 221. In the side view, FIG. 12, one horizontal LC 210 in the upper layer is connected to one electrical connector 112 on the cable box 100 through the electrical connector 211 thereon; the SC 220 is connected to 16 electrical connectors 111 on the cable box 100 through 16 electrical connector 221 thereon; and one LC 210 in the lower layer is connected to the electrical connector 112 on the cable box 100 through the electrical connector 211 thereon. The cable box 100 includes 16 cable assemblies 130, and each cable assembly 130 connects one electrical connector 112 for the LC in the upper layer, one electrical connector 112 for the LC in the lower layer, and one electrical connector 111 for the SC in the middle layer, that is, each assembly includes two electrical connectors 112 for LCs and one electrical connector 111 for the SC, and then the two electrical connectors 112 for LCs are separately connected to the one electrical connector 111 for the SC through cables 140. That is to say, each cable assembly 130 may enable the SC 220 to be connected to one LC 210 in the upper layer and one LC 210 in the lower layer. The 16 cable assemblies 130 in one cable box 100 may connect 16 electrical connectors 221 on one SC 220 to each 16 LCs 210 in the upper and lower layers, thereby achieving connections between the vertical SC and all the LCs. 9 cable boxes 100 may achieve connections between the 9 SCs and all the LCs.

Meanwhile, 2 groups of electrical connectors for 16 LCs and 16 electrical connectors for the SC may have the same interval, and may be arranged at equal intervals. The electrical connectors corresponding to LC1 and LC17 and a first electrical connector on the SC may be preferably selected as one assembly. In the same way, the 16 cable assemblies may be made into same assemblies, so as to greatly reduce the processing difficulty of the cable assembly and reduce the costs of the cable backplane board.

In the top view, FIG. 13, the cable boxes 100 are included, and each cable box 100 includes electrical connectors connected to the LCs and electrical connectors connected to the SC, where the electrical connectors connected to the LCs and the electrical connectors connected to the SC overlap in the top view and are represented as the electrical connector 110, corresponding to an electrical connector 230 which is the electrical connectors on the LC in the upper and lower layers (210 drawn by solid lines) and the SC (220 drawn by dashed lines and filled with gray). This embodiment provides a double-faced three-layer sub-rack (16 LCs are vertically inserted in the single layer on the single face and 9 SCs are horizontally inserted), and one cable box is mated with one column of vertical insertion boards. 16 LCs are vertically placed in the upper layer on the front face, namely LC1 to LC16; 9 SCs are horizontally placed in the middle layer on the front face, namely SC1 to SC9; 16 LCs are vertically placed in the lower layer on the front face, namely LC17 to LC32; 16 LCs are vertically placed in the upper layer on the back face, namely LC33 to LC48; 9 SCs are horizontally placed in the middle layer on the back face, namely SC10 to SC18; and 16 LCs are vertically placed in the lower layer on the back face, namely LC49 to LC64. The LCs in the upper layer may be inserted in the same direction as the LCs in the lower layer, or the LCs in the upper layer may be inserted in an opposite direction to that of the LCs in the lower layer (for example, the LCs in the upper layer are inserted upright, and the LCs in the lower layer are inserted upside down). This embodiment illustrates opposite insertion directions.

Figure 14:
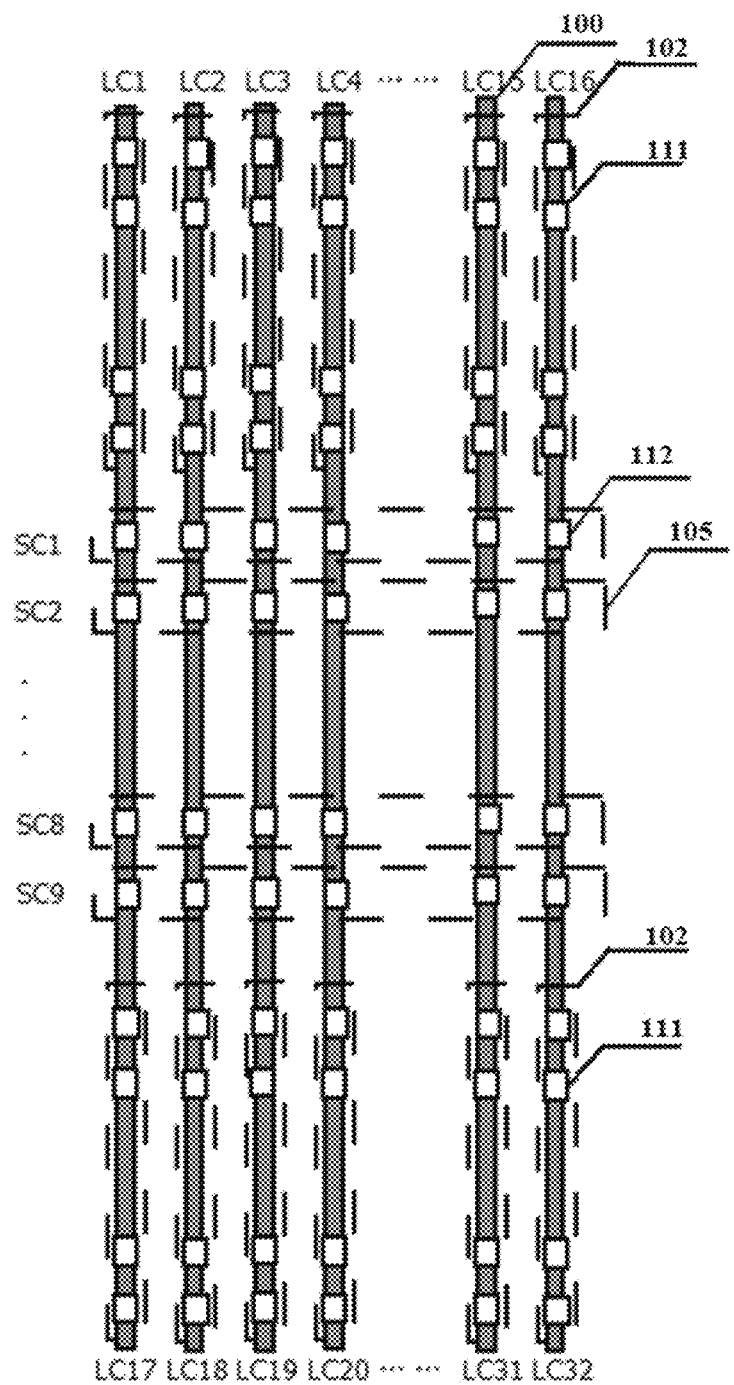
FIG. 14 is a front view showing a sub-rack according to an embodiment of the present application.
Figure 15:
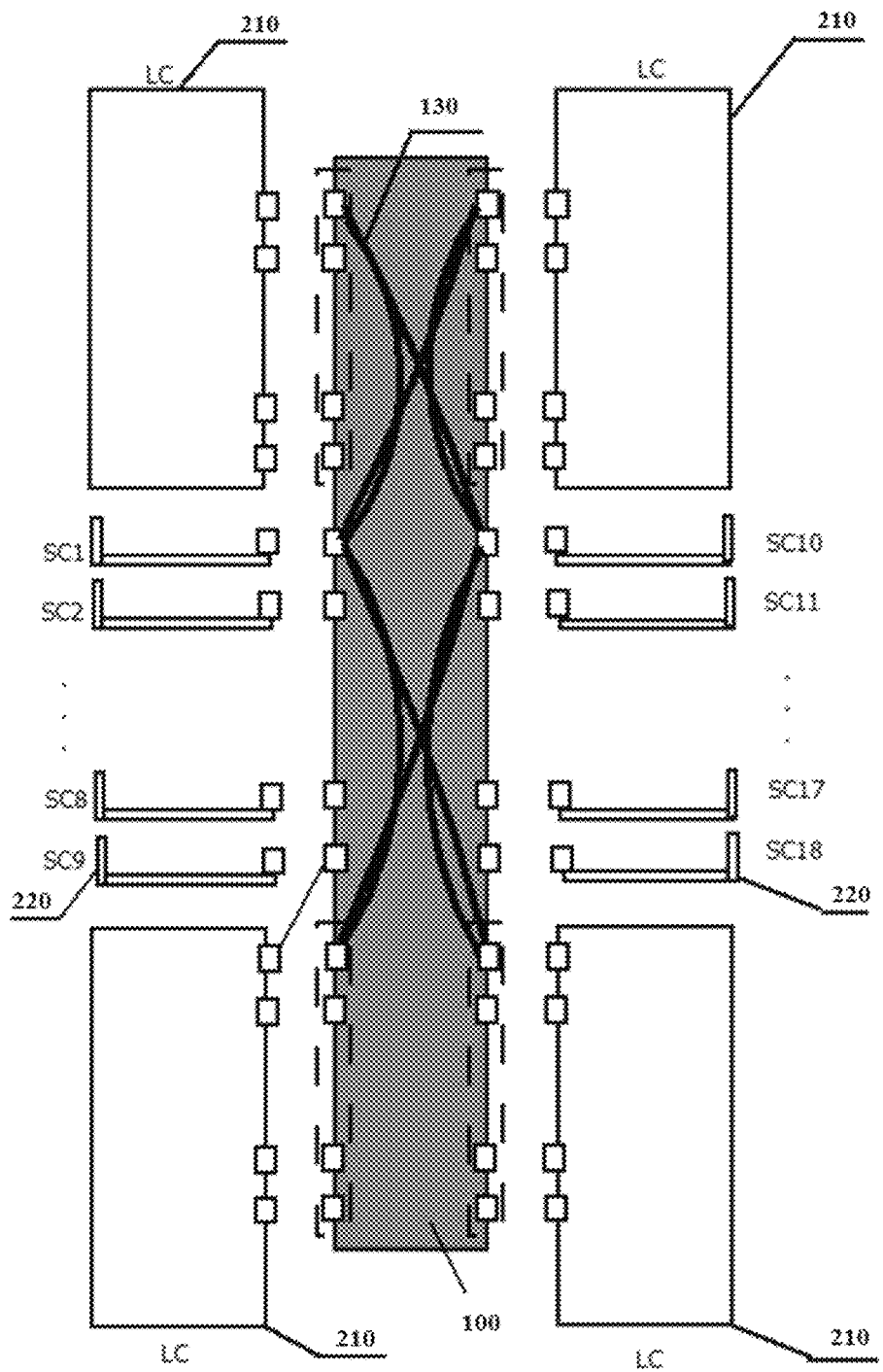
FIG. 15 is a side view showing a sub-rack according to an embodiment of the present application.
Figure 16:
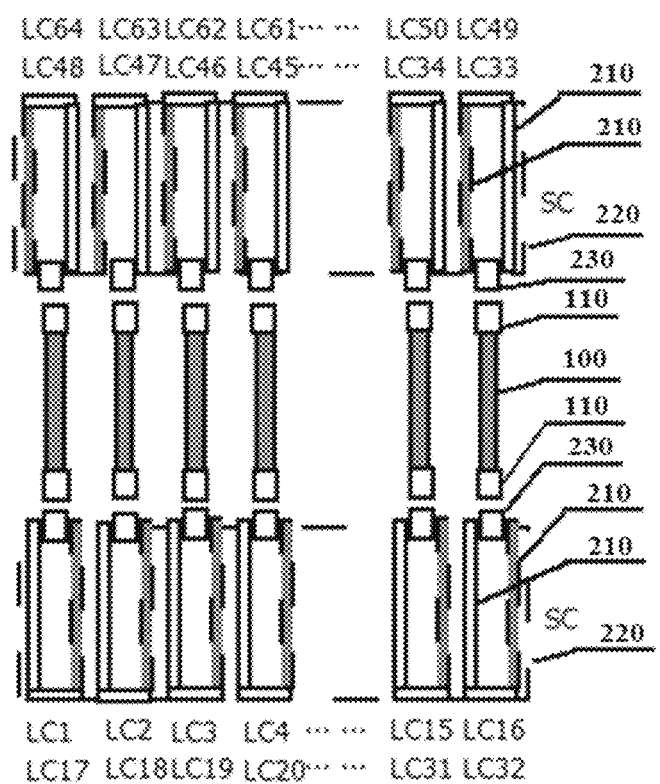
FIG. 16 is a top view showing a sub-rack according to an embodiment of the present application.

In this embodiment, the first-type single board is the LC, and the second-type board is the SC. FIGS. 14, 15 and 16 are respectively a front view, a side view and a top view of the sub-rack in this embodiment. The front view, FIG. 14, does not show LCs and SCs, but shows cable boxes 100, a region 102 (a dashed box) of electrical connectors on the cable backplane board corresponding to the LC and a region 105 (a dashed box) of electrical connectors on the cable backplane board corresponding to the SC. The cable backplane board includes 16 vertical cable boxes 100. Each cable box 100 is connected to 4 LCs in the upper and lower layers on the front and back faces, where each LC is connected to 9 electrical connectors 111; and each cable box is connected to all SCs on the front and back faces, each of which is connected to one electrical connector 112. Each SC is connected to all the 16 cable boxes 100 through 16 electrical connectors.

In the side view, FIG. 15, one LC 210 in the upper layer on the front face is connected to 9 electrical connectors on one cable box 100 through 9 electrical connectors thereon; one LC 210 in the upper layer on the back face is connected to 9 electrical connectors on one cable box 100 through 9 electrical connectors thereon; one LC 210 in the lower layer on the front face is connected to 9 electrical connectors on one cable box 100 through 9 electrical connectors thereon; one LC 210 in the lower layer on the back face is connected to 9 electrical connectors on one cable box 100 through 9 electrical connectors thereon; the SC 220 in the middle layer on the front face is connected to one electrical connector on the cable box 100 through the electrical connector thereon; and one SC 220 in the middle layer on the back face is connected to one electrical connector on one cable box 100 through the electrical connector thereon. The cable box 100 includes 9 cable assemblies 130, and each cable assembly 130 connects one electrical connector for the LC in the upper layer on the front face, one electrical connector for the LC in the lower layer on the front face, one electrical connector for the LC in the upper layer on the back face, one electrical connector for the LC in the lower layer on the back face, one electrical connector for the SC in the middle layer on the front face, and one electrical connector for the SC in the middle layer on the back face, that is, each assembly includes 4 electrical connectors for LCs and 2 electrical connectors for SCs, and then the 4 electrical connectors for LCs are separately cross-connected to the 2 electrical connectors for SCs through cables. 9 assemblies may connect 9 electrical connectors corresponding to each of all 4 LCs and 18 electrical connectors corresponding to the 18 SCs. The electrical connector on the cable box corresponding to each SC is connected to electrical connectors on the cable box corresponding to 4 LCs through cables. Meanwhile, on the cable box, electrical connectors corresponding to LCs and electrical connectors corresponding to SCs may be arranged at equal intervals. The electrical connectors corresponding to SC1 and SC10 and first electrical connectors corresponding to LCs may be preferably selected as one assembly. In the same way, the 9 cable assemblies may be made into same assemblies, so as to greatly reduce the processing difficulty of the cable assembly and reduce the costs of the cable backplane board.

In the top view, FIG. 16, 16 cable boxes 100 are included, and each cable box 100 includes electrical connectors connected to the LCs and electrical connectors connected to the SCs, where the electrical connectors connected to the LCs and the electrical connectors connected to the SCs overlap in the top view and are represented as the electrical connectors 110, corresponding to electrical connectors 230 which are the electrical connectors on the LC in the upper layer on the front face (210 drawn by solid lines), the SC on the front face (220 drawn by dashed lines), the LC in the lower layer on the front face (210 drawn by dashed lines and filled with gray), the LC in the upper layer on the back face (210 drawn by solid lines), the SC on the back face (220 drawn by dashed lines), and the LC in the lower layer on the back face (210 drawn by dashed lines and filled with gray).

This embodiment provides a single-faced two-layer sub-rack (16 LCs are vertically inserted and 6 SCs are horizontally inserted), and one cable box is mated with two columns of vertical insertion boards. The 16 LCs are vertically placed in the upper layer, namely LC1 to LC16, and the 6 SCs are horizontally placed in the lower layer, namely SC1 to SC6.

Figure 17:
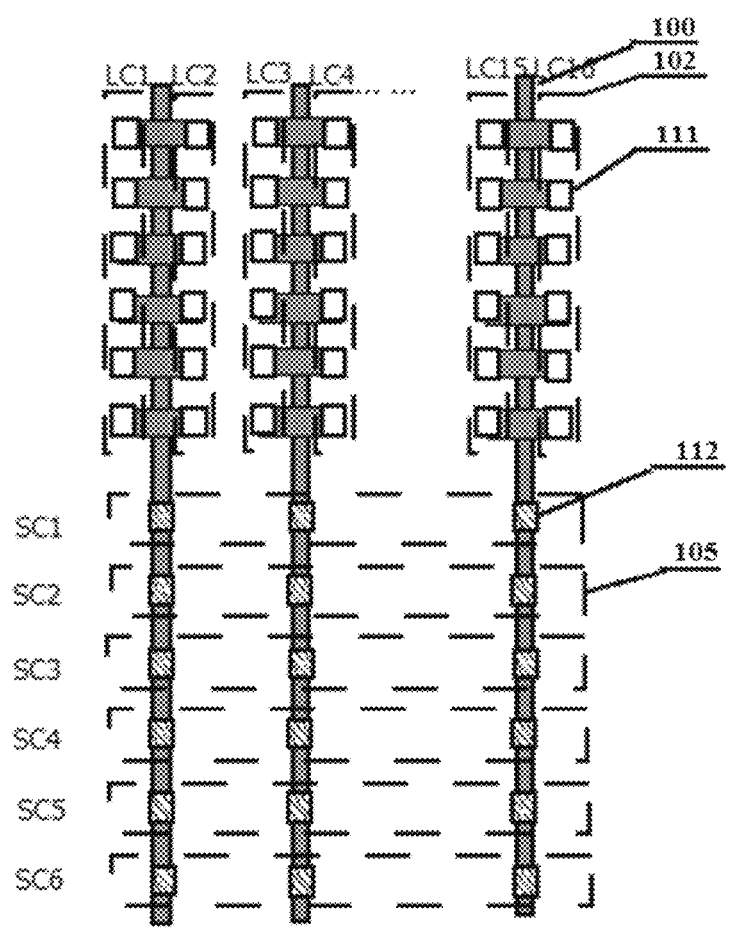
FIG. 17 is a front view showing a sub-rack according to an embodiment of the present application.
Figure 18:
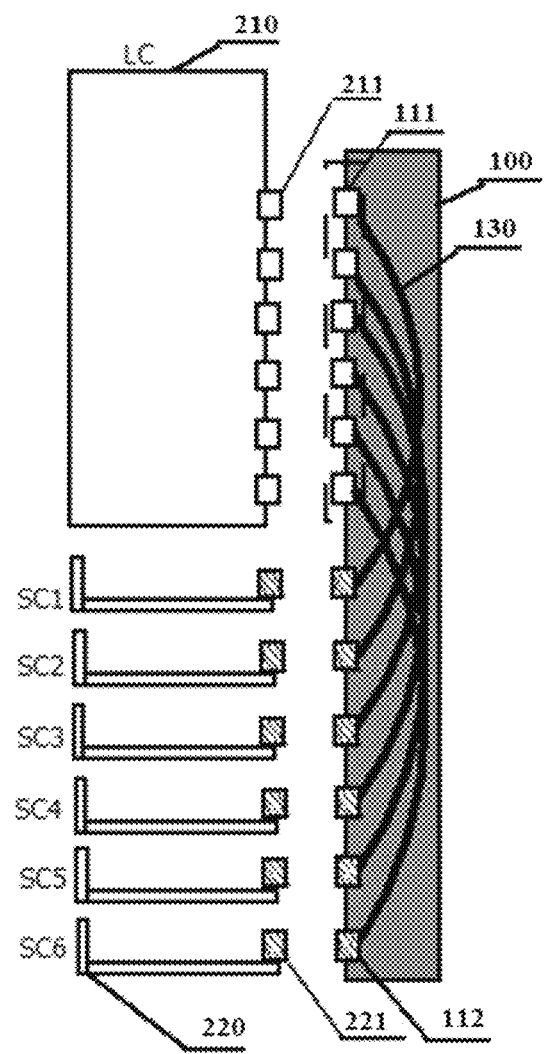
FIG. 18 is a side view showing a sub-rack according to an embodiment of the present application.
Figure 19:
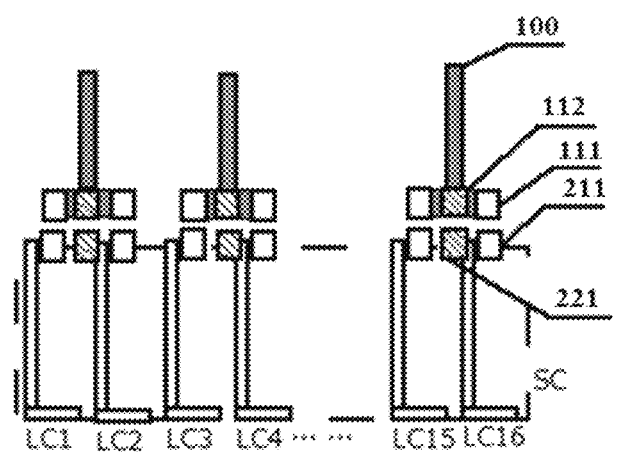
FIG. 19 is a top view showing a sub-rack according to an embodiment of the present application.

In this embodiment, the first-type single board is the LC, and the second-type board is the SC. FIGS. 17, 18 and 19 are respectively a front view, a side view and a top view of the sub-rack in this application embodiment. The front view, FIG. 17, shows the cable backplane board which includes 8 cable boxes 100, and each cable box 2 corresponds to two columns of vertical LCs. For the LCs and SCs, only a region 102 (a dashed box) of connectors on the cable backplane board corresponding to the LC and a region 105 (a dashed box) of connectors on the cable backplane board corresponding to the SC are shown. The cable backplane board includes 8 vertical cable boxes. Each cable box 2 is connected to two LCs, where each LC is connected to 6 electrical connectors; and each cable box is connected to all the SCs, each of which is connected to one electrical connector. Each SC is connected to all the 8 cable boxes through 8 electrical connectors thereon.

In the side view, FIG. 18, one LC 210 is connected to 6 electrical connectors 111 on one cable box 100 through 6 electrical connectors 211 thereon; and the SC 220 is connected to one electrical connector 112 on the cable box through the electrical connector 221 thereon. One cable box includes 6 cable assemblies 130, and each cable assembly connects two electrical connectors on the LCs to one electrical connector on the SC. Therefore, the 6 cable assemblies may connect all 12 electrical connectors corresponding to two LCs to 6 electrical connectors corresponding to the 6 SCs. Meanwhile, 6 electrical connectors corresponding to the LC and 6 electrical connectors corresponding to the SCs may be arranged at equal intervals. In this way, the 6 cable assemblies may be made into same assemblies, so as to greatly reduce the processing difficulty of the cable assembly and reduce the costs of the cable backplane board. In the top view, FIG. 19, the cable boxes 100 are included, and each cable box includes electrical connectors 111 connected to the LCs and electrical connectors 112 connected to the SCs, where the corresponding electrical connector on the LC is 211 and the corresponding electrical connector on the SC is 221.

Since one cable box is mated with two columns of vertical insertion boards, the one cable box includes two columns of electrical connectors, and the box body of whole cable box is an irregular rectangular parallelepiped structure. To mount the electrical connectors, one structural member protrudes from each side of the cable box.

In this embodiment, since one cable box is mated with two columns of vertical insertion boards, the one cable box includes two columns of electrical connectors, that is, two electrical connectors are separately mated with two LCs, corresponding to 111 in FIG. 17, and one electrical connector mated with the SC is further needed, corresponding to 112 in FIG. 17. The electrical connectors corresponding to each LC are connected to the electrical connectors corresponding to the SCs through multiple cables, that is, two electrical connectors for LCs are separately connected to one electrical connector for the SC through cables.

To fix the cable assembly and assemble the cable backplane board, the box body of the cable box is empty inside and can accommodate high-speed cables. However, the box body for placing the cables does not correspond to positions of the vertical insertion boards, so it is impossible to directly form openings on its insertion face to fix connectors on the vertical insertion boards. In this application embodiment, one rectangular parallelepiped for placing the electrical connector is added on each side of the box body for placing cables. On the one hand, the rectangular parallelepiped is connected to the box body for placing cables, and its contact face is provided with an opening for the cable to penetrate. On the other hand, an opening is directly formed on an insertion face of the rectangular parallelepiped with the vertical card to fix the connector 111 for the vertical card. Moreover, an opening is directly formed on the box body of the cable box to fix the connector 112 for the horizontal card.

It can be seen that in the cable backplane board in this embodiment, each cable box is mated with two columns of vertical insertion boards, and a total of 8 cable boxes are required, while in some embodiments, 16 cable boxes are required. In this way, a number of cable boxes is reduced, so that a width of a gap between cable boxes in the layer of horizontal insertion boards can be increased, which is conducive to the front-back ventilation and heat dissipation of the layer of horizontal insertion boards.

In this way, the interconnection of high-speed signals between cards in the sub-rack can be achieved through the cable backplane board, thereby effectively improving the switching capacity of the sub-rack. In all the embodiments, only the interconnection of high-speed service signals is described, and neither the interconnection of low-speed signals nor the interconnection of power supplies is described. The low-speed signals, the power supplies, etc. may be connected by use of cables or a traditional PCB on the periphery of the cards in the sub-rack.

Although the embodiments disclosed by the present application are as described above, the content thereof is merely embodiments for facilitating the understanding of the present application and not intended to limit the present application. Any person skilled in the art to which the present application pertains may make any modifications and variations on the implementation forms and details without departing from the spirit and scope disclosed by the present application, but the patent protection scope of the present application is still subject to the scope defined by the appended claims.

What is claimed is:

1. A cable backplane board, capable of being mounted on a sub-rack and comprising:
at least one cable box, wherein each of the at least one cable box comprises a box body and at least one cable assembly, and each of the at least one cable assembly comprises at least two electrical connectors and at least one cable, where the at least two electrical connectors are fixed to the box body, the at least one cable is disposed inside the box body, and the at least two electrical connectors are connected to each other through the at least one cable; and a plurality of single boards on the sub-rack is interconnected through electrical connectors and cables.

2. The cable backplane board of claim 1, further comprising: at least one structural fixing member for fixing the at least one cable box.

3. The cable backplane board of claim 1, wherein a front face of each of the at least two electrical connectors is connected to one of the plurality of single boards, a back face of the each of the at least two electrical connectors is connected to one or more cables, and two ends of each of the at least one cable are separately connected to two electrical connectors.

4. The cable backplane board of claim 3, wherein each of the at least two electrical connectors comprises a first-type electrical connector and a second-type electrical connector, wherein the first-type electrical connector is configured to be connected to a first-type single board, the second-type electrical connector is configured to be connected to a second-type board, and an end of each of the at least one cable is connected to the first-type electrical connector and the other end of the each of the at least one cable is connected to the second-type electrical connector.

5. The cable backplane board of claim 4, wherein each of the plurality of single boards comprises the first-type single board vertically mounted in the sub-rack and the second-type board horizontally mounted in the sub-rack, and each of the at least one cable box is vertically mounted in the sub-rack and configured to be connected to all first-type single boards in one or more vertical columns in the sub-rack and each second-type board horizontally mounted in the sub-rack.

6. The cable backplane board of claim 5, wherein the each of the at least one cable box is connected to each of the first-type single boards in the one or more vertical columns through at least one first-type electrical connector; and the each of the at least one cable box is connected to the each second-type board horizontally mounted through one second-type electrical connector.

7. The cable backplane board of claim 6, wherein the each of the at least one cable box is connected to the each of the first-type single boards in the one or more vertical columns through n first-type electrical connectors, wherein n is a number of second-type boards horizontally mounted in a single layer on a single face of the sub-rack.

8. The cable backplane board of claim 5, wherein each of the at least one cable box comprises n cable assemblies, wherein n is a number of second-type boards horizontally mounted in a single layer on a single face of the sub-rack.

9. The cable backplane board of claim 8, wherein each of then cable assemblies in the each of the at least one cable box comprises p first-type electrical connectors and q second-type electrical connectors, wherein p is a number of the first-type single boards in the one or more vertical columns corresponding to the each of the at least one cable box, and the p first-type electrical connectors are separately connected to the p first-type single boards corresponding to the each of the at least one cable box; and in response to the sub-rack being single-faced, q is 1, and the q second-type electrical connector are connected to one second-type board horizontally mounted in the single layer on the single face, and in response to the sub-rack being double-faced, q is 2, and the q second-type electrical connectors are separately connected to one second-type board on each face of the sub-rack.

10. The cable backplane board of claim 1, wherein
at least one of a front face or a back face of the box body is provided with an opening through which one of the at least two electrical connectors is fixed to the box body; or
structural member are provided on both sides of the box body, wherein one of the at least two electrical connectors is fixed to the box body through the structural members.

11. The cable backplane board of claim 4, wherein
the first-type single board is a line card (LC), the second-type board is a switch card (SC), the first-type electrical connector is used for being connected to the LC, and the second-type electrical connector is used for being connected to the SC; or
the first-type single board is an SC, the second-type board is an LC, the first-type electrical connector is used for being connected to the SC, and the second-type electrical connector is used for being connected to the LC.

12. A cable box, comprising a box body and at least one cable assembly, wherein each of the at least one cable assembly comprises at least two electrical connectors and at least one cable, wherein the at least two electrical connectors are fixed to the box body, the at least one cable is disposed inside the box body, and the at least two electrical connectors are connected to each other through the at least one cable; and a plurality of single boards on a sub-rack is interconnected through electrical connectors and cables.

13. The cable box of claim 12, where a front face of each of the at least two electrical connectors is connected to one of the plurality of single boards, a back face of the each of the at least two electrical connectors is connected to one or more cables, and two ends of each of the at least one cable are separately connected to two electrical connectors.

14. The cable box of claim 13, wherein each of the at least two electrical connectors comprises a first-type electrical connector and a second-type electrical connector, wherein the first-type electrical connector is configured to be connected to a first-type single board, the second-type electrical connector is configured to be connected to a second-type board, and an end of each of the at least one cable is connected to the first-type electrical connector and the other end of the each of the at least one cable is connected to the second-type electrical connector.

15. The cable box of claim 14, wherein each of the plurality of single boards comprises the first-type single board vertically mounted in the sub-rack and the second-type board horizontally mounted in the sub-rack, and the cable box is vertically mounted in the sub-rack and configured to be connected to all first-type single boards in one or more vertical columns in the sub-rack and each second-type board horizontally mounted in the sub-rack.

16. The cable box of claim 15, comprising n cable assemblies, wherein n is a number of second-type boards horizontally mounted in a single layer on a single face of the sub-rack.

17. The cable box of claim 16, wherein each of then cable assemblies in the cable box comprises p first-type electrical connectors and q second-type electrical connectors,
wherein p is a number of the first-type single boards in the one or more vertical columns corresponding to the cable box, and the p first-type electrical connectors are separately connected to p first-type single boards corresponding to the cable box; and in response to the sub-rack being single-faced, q is 1, and the q second-type electrical connector are connected to one second-type board horizontally mounted in the single layer on the single face, and in response to the sub-rack being double-faced, q is 2, and the q second-type electrical connectors are separately connected to one second-type board on each face of the sub-rack.

18. The cable box of claim 12, wherein
at least one of a front face or a back face of the box body is provided with an opening through which one of the at least two electrical connectors is fixed to the box body; or
structural members are provided on both sides of the box body, wherein one of the at least two electrical connectors is fixed to the box body through the structural members.

19. A cable assembly, comprising at least two electrical connectors and at least one cable, wherein the at least two electrical connectors are connected to each other through the at least one cable, a front face of each of the at least two electrical connectors is connected to a single board, a back face of the each of the at least two electrical connectors is connected to one or more cables, and two ends of each of the at least one cable are separately connected to two electrical connectors.

20. The cable assembly of claim 19, wherein each of the at least two electrical connectors comprises a first-type electrical connector and a second-type electrical connector,
wherein the first-type electrical connector is configured to be connected to a first-type single board, the second-type electrical connector is configured to be connected to a second-type board, and an end of each of the at least one cable is connected to the first-type electrical connector and the other end of the each of the at least one cable is connected to the second-type electrical connector.

* * * * *